US007781241B2

(12) United States Patent
Ando et al.

(10) Patent No.: US 7,781,241 B2
(45) Date of Patent: Aug. 24, 2010

(54) GROUP III-V SEMICONDUCTOR DEVICE AND METHOD FOR PRODUCING THE SAME

(75) Inventors: Masanobu Ando, Aichi-ken (JP);
Shigemi Horiuchi, Aichi-ken (JP);
Yoshinori Kinoshita, Aichi-ken (JP);
Ryohei Inazawa, Aichi-ken (JP);
Toshiya Uemura, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 118 days.

(21) Appl. No.: 11/987,420

(22) Filed: Nov. 29, 2007

(65) Prior Publication Data

US 2008/0149953 A1   Jun. 26, 2008

(30) Foreign Application Priority Data

Nov. 30, 2006   (JP)   ............................. 2006-323949
Nov. 30, 2006   (JP)   ............................. 2006-323950

(51) Int. Cl.
*H01L 21/00*   (2006.01)
(52) U.S. Cl. ..................... 438/26; 438/404; 257/94; 257/506
(58) Field of Classification Search .............. 257/94, 257/98, 99, 506, E21.002, E21.398, E33.059; 438/26, 404
See application file for complete search history.

(56) References Cited

U.S. PATENT DOCUMENTS 6,169,297 B1 *   1/2001   Jang et al. ...................... 257/99
6,573,599 B1 *   6/2003   Burton et al. ................ 257/745

FOREIGN PATENT DOCUMENTS

| JP | 2005-522873 | 7/2005 |
| JP | 2005-333130 | 12/2005 |
| JP | 2006-135321 | 5/2006 |

* cited by examiner

*Primary Examiner*—Thinh T Nguyen
(74) *Attorney, Agent, or Firm*—McGinn IP Law Group, PLLC

(57) ABSTRACT

The method of the invention for producing a group III-V semiconductor device includes forming, on a base, a plurality of semiconductor devices isolated from one another, each semiconductor device having at least an n-layer proximal to the base, and a p-layer distal to the base, and having a p-electrode formed on the top surface of the p-layer, and a first low-melting-point metal diffusion preventing layer, the low-melting-point metal diffusion preventing layer being formed on the top surface of the p-electrode; forming, from a dielectric material, a side-surface protective film so as to cover a side surface of each semiconductor device; bonding the semiconductor device to a conductive support substrate via a low-melting-point metal layer; and removing the base through the laser lift-off process.

15 Claims, 9 Drawing Sheets

GROUP III-V SEMICONDUCTOR DEVICE AND METHOD FOR PRODUCING THE SAME

BACKGROUND OF THE INVENTION

1. Field of the Invention

The present invention relates to a method for producing a semiconductor device which method includes growing an n-layer and a p-layer of a group III-V semiconductor on a growth substrate, bonding an electrode layer on the p-layer to a support substrate by use of solder, and removing the growth substrate through the laser lift-off process; and to a semiconductor device produced through the method. More particularly, the present invention relates to a method for producing a semiconductor device so as to prevent short circuit between side surfaces of a p-layer and an n-layer, and to protect the semiconductor device from cracking, which would otherwise occur in side surfaces of the device during the laser lift-off process; and to a semiconductor device structure produced through the method.

2. Background Art

In general, sapphire, which is chemically and thermally stable, has been employed as a substrate for the growth of a group III nitride semiconductor. However, since sapphire has no electrical conductivity, current cannot flow in a vertical direction of a semiconductor stacked structure including a sapphire substrate. Furthermore, sapphire has no clear cleavage plane, making dicing of a semiconductor structure on a sapphire substrate difficult. In addition, sapphire exhibits low thermal conductivity, and inhibits radiation of heat from a semiconductor device. In a semiconductor device including a semiconductor layer and a sapphire substrate, external quantum efficiency is low due to total reflection at the interface between the semiconductor layer and the substrate, or confinement of light in the semiconductor layer. Meanwhile, one conceivable technique for improving light extraction efficiency is forming irregularities on a light extraction surface. However, a sapphire substrate encounters difficulty in such a processing.

One technique known to solve such a problem is the laser lift-off process, which is used for separation and removal of a sapphire substrate through laser beam radiation.

Japanese Patent Application Laid-Open (kokai) No. 2005-333130 discloses a method in which a group III nitride semiconductor device is formed on a sapphire substrate; grooves are formed in the device through etching for separating the device into chips; and each group III nitride semiconductor device grown on the sapphire substrate is bonded to a support substrate, followed by the laser lift-off process. Japanese Patent Application Laid-Open (kokai) No. 2005-333130 describes that cracking in the group III nitride semiconductor device which would otherwise caused by thermal expansion of gas remaining in the grooves through laser beam radiation can be prevented by filling the grooves with a dielectric material for elimination of gas.

Japanese Kohyo Patent Publication No. 2005-522873 discloses a method in which grooves are filled with a photoresist; and, instead of bonding between a group III nitride semiconductor device and a support substrate, a metal layer is formed on the group III nitride semiconductor device, followed by the laser lift-off process. This patent document describes that grooves are filled with a photoresist for the purpose of preventing a metal from entering the grooves during formation of a layer of the metal.

Japanese Patent Application Laid-Open (kokai) No. 2006-135321 discloses a method in which a protective film of, for example, $SiO_2$ or $Al_2O_3$, and a seed metal film are formed on inclined side surfaces of a semiconductor device; and a metal layer is formed on grooves and the semiconductor device, followed by the laser lift-off process.

During removal of a sapphire substrate through the laser lift-off process, physical impact may be applied to side surfaces of a group III nitride semiconductor device, and cracking may occur in the side surfaces. Japanese Patent Application Laid-Open (kokai) Nos. 2005-333130 and 2006-135321 and Japanese Kohyo Patent Publication No. 2005-522873 do not describe a method for preventing such physical-impact-induced cracking in side surfaces of a semiconductor device.

The method disclosed in Japanese Patent Application Laid-Open (kokai) No. 2006-135321 poses a problem in that, since a sapphire substrate (growth substrate) and a protective film are strongly bonded to each other, exfoliation occurs in the protective film during separation of the sapphire substrate, leading to cracking in a semiconductor device. This method also poses a problem in that a metal layer formed on the semiconductor device must be cut during dicing. Meanwhile, the method disclosed in Japanese Kohyo Patent Publication No. 2005-522873 or Japanese Patent Application Laid-Open (kokai) No. 2006-135321 does not employ bonding of a semiconductor device to a support substrate.

Bonding of a semiconductor device to a support substrate poses problems as described below. Formation of an n-layer on a growth substrate precedes formation of a p-layer, since the p-layer must be activated. Although the n-layer can be formed to have a large thickness, the p-layer encounters difficulty in attaining a large thickness; i.e., the p-layer has a small thickness. Thus, in a structure in which the p-layer is bonded to a support substrate by use of solder, the distance between the support substrate and the n-layer is small. Therefore, solder or metal may be deposited on side surfaces of a semiconductor device during dicing or wafer bonding, resulting in short circuit between the p-layer and the n-layer.

SUMMARY OF THE INVENTION

In view of the foregoing, in a method in which, firstly, an n-layer is formed on a base, followed by formation of a p-layer; the resultant semiconductor layer is separated into semiconductor devices; each of the semiconductor devices is bonded to a support substrate by the mediation of solder; and the base is removed through the laser lift-off process, an object of the present invention is to prevent short circuit between the n-layer and the p-layer at a side surface of the semiconductor device. Another object of the present invention is to prevent cracking in the semiconductor device side surface, which would otherwise caused by physical impact generated during separation of the base.

Accordingly, in a first aspect of the present invention, there is provided a method for producing a group III-V semiconductor device, the method comprising forming, on a base, i.e. growth substrate, a plurality of semiconductor devices isolated from one another, each semiconductor device having at least an n-conduction-type layer (hereinafter may be referred to as an "n-layer") proximal to the base, and a p-conduction-type layer (hereinafter may be referred to as a "p-layer") distal to the base, and having a p-electrode formed on the top surface of the p-layer, and a first layer for preventing diffusion of a metal of low melting point (hereinafter such a layer may be referred to as a "low-melting-point metal diffusion preventing layer"), the low-melting-point metal diffusion preventing layer being formed on the top surface of the p-electrode;

forming, from a dielectric material, a protective film so as to cover a side surface of each semiconductor device (hereinafter the film may be referred to as a "side-surface protective film");

bonding the semiconductor device to a conductive support substrate via a low-melting-point metal layer; and removing the base through the laser lift-off process.

In a second aspect of the present invention, there is provided a method for producing a group III-V semiconductor device, the method comprising forming, on a base, a plurality of semiconductor devices isolated separated from one another, each semiconductor device having at least an n-layer proximal to the base, and a p-layer distal to the base, and having a p-electrode formed on the top surface of the p-layer, and a first low-melting-point metal diffusion preventing layer formed on the top surface of the p-electrode;

forming a buffer layer on the top surface of the base and at least in the vicinity of a side surface of each semiconductor device;

forming, from a dielectric material, a side-surface protective film so as to cover a side surface of the semiconductor device;

bonding the semiconductor device to a conductive support substrate via a low-melting-point metal layer; removing the base through the laser lift-off process; and removing the buffer layer, wherein the bonding strength of the buffer layer to the base or the side-surface protective film is lower than the bonding strength between the base and the side-surface protective film.

A third aspect of the present invention is drawn to a specific embodiment of the production method according to the first aspect, wherein the method further comprises forming, at least on the top edge of the side-surface protective film, a film of a metal which has a good bonding property to the dielectric material; and forming a second low-melting-point metal diffusion preventing layer on the top surface of the metal film.

A fourth aspect of the present invention is drawn to a specific embodiment of the production method according to the second aspect, wherein the method further comprises forming, at least on the top edge of the side-surface protective film, a film of a metal which has a good bonding property to the dielectric material; and forming a second low-melting-point metal diffusion preventing layer on the top surface of the metal film.

In any of the aforementioned aspects, the side-surface protective film preferably has a thickness of 100 nm to 500 nm. The side-surface protective film may be formed through, for example, plasma CVD. When the top surface of the semiconductor device has a region on which neither the p-electrode nor the low-melting-point metal diffusion preventing layer is formed, the side-surface protective film may be formed to cover the region.

In the third or fourth aspect, the metal film, which is formed at least on the top edge of the side-surface protective film, may be formed on the top surface of the first low-melting-point metal diffusion preventing layer and on the top edge of the side-surface protective film. Alternatively, the metal film may be formed so as to cover the first low-melting-point metal diffusion preventing layer and the side-surface protective film so that the metal film is provided on the side surface of the semiconductor device so as to cover the side-surface protective film.

The p-electrode preferably comprises a metal having high optical reflectance and low contact resistance; for example, Ag, Rh, Pt, Ru, or an alloy containing such a metal as a primary component. Alternatively, the p-electrode may comprise, for example, Ni, an Ni alloy, or an Au alloy; or may comprise a composite layer including a transparent electrode film (e.g., ITO film) and a highly reflective metal film. The low-melting-point metal diffusion preventing layer may comprise, for example, a Ti/Ni-containing multi-layer film (e.g., Ti/Ni/Au film), or a W/Pt-containing multi-layer film (e.g., W/Pt/Au film). The low-melting-point metal diffusion preventing layer is provided for preventing diffusion therethrough of a metal constituting the low-melting-point metal layer. The low-melting-point metal layer may comprise a eutectic metal layer (e.g., an Au—Sn layer, an Au—Si layer, an Ag—Sn—Cu layer, or an Sn—Bi layer); or may comprise, for example, a layer of Au, Sn, or Cu (although such a metal is not a low-melting-point metal).

The n-layer or p-layer of the semiconductor device may be a multiple layer including a plurality of layers having different compositions, or may include an intrinsic semiconductor layer. An active layer (e.g., an MQW layer or an SQW layer) may be provided between the n-layer and the p-layer.

The support substrate is formed of a conductive substrate such as an Si substrate, a GaAs substrate, a Cu substrate, or a Cu—W substrate.

In the second or fourth aspect, the buffer layer is provided between the base and the side-surface protective film. Therefore, the base is not bonded directly to the side-surface protective film.

After removal of the buffer layer, a step corresponding to the thickness of the buffer layer is provided between the top surface of the semiconductor device and the top edge of the side-surface protective film.

Deposition of the buffer layer on the side surface of the semiconductor device is not preferred, since a dielectric film is not formed at a portion on which the buffer layer is deposited. Therefore, preferably, the side surface of the semiconductor device has virtually no inclination angle, and most preferably, the side surface is perpendicular to the base. The thickness of the buffer layer is preferably reduced to a minimum possible level. This is because a region on which the side-surface protective film is formed can be broadened. The buffer layer may be formed of an organic film (e.g., resist film) or an Au film.

Preferably, the buffer layer is formed between the base and the end surface of the side-surface protective film. This requirement is satisfied, so long as the buffer layer is formed on the top surface of the base and in the vicinity of the side surface of the semiconductor device. Needless to say, the buffer layer may be formed on the entire top surface of the base. For example, the buffer layer may be formed so as to cover the base and the semiconductor device, followed by removal of a portion of the layer that is provided on a region other than the top surface of the base.

A fifth aspect of the present invention is drawn to a specific embodiment of the production method according to the second or fourth aspect, wherein the buffer layer comprises at least one of a resist film and an Au film.

When a resist film is employed, the thickness thereof is preferably 1 μm or less. When an Au film is employed, if the film is deposited on the side surface of the semiconductor device, the film must be washed out or removed. Therefore, the Au film thickness is preferably 25 to 50 nm.

A sixth aspect of the present invention is drawn to a specific embodiment of the production method according to any of the first to fourth aspects, wherein the side-surface protective film comprises at least one of silicon dioxide, silicon nitride, zirconium oxide, niobium oxide, aluminum oxide, polyimide, polyamide and polyimide-amid. In the third or fourth aspect, the metal film is preferably made of a metal which has a good bonding property to such a dielectric material; for example, Al, Ti, Ni, or V.

A seventh aspect of the present invention is drawn to a specific embodiment of the production method according to the third or fourth aspect, wherein the side-surface protective film comprises silicon dioxide, and the metal film comprises an Al film.

A eighth aspect of the present invention is drawn to a specific embodiment of the production method according to any of the first to fourth aspects, wherein the low-melting-point metal layer comprises at least one of Au—Sn, Au—Si, Ag—Sn—Cu, and Sn—Bi.

An ninth aspect of the present invention is drawn to a specific embodiment of the production method according to any of the first to fourth aspects, wherein the semiconductor device is formed of a group III nitride semiconductor.

A tenth aspect of the present invention is drawn to a specific embodiment of the production method according to any of the first to fourth aspects, wherein the semiconductor device is a light-emitting device.

In a eleventh aspect of the present invention, there is provided a group III-V semiconductor device comprising a low-melting-point metal layer, a p-layer proximal to a conductive support substrate, and an n-layer distal to the support substrate, the semiconductor device being bonded to the support substrate via the low-melting-point metal layer, wherein a base, i.e., growth substrate, bonded to the n-layer has been removed, and the semiconductor device has, on a side surface thereof, a side-surface protective film comprising a dielectric material.

In an twelfth aspect of the present invention, there is provided a group III-V semiconductor device comprising a low-melting-point metal layer, the semiconductor device being bonded to a conductive support substrate via the low-melting-point metal layer, wherein the semiconductor device has, on a side surface thereof, a side-surface protective film comprising a dielectric material, and has, between the side-surface protective film and the low-melting-point metal layer, a metal film made of a metal which has a good bonding property to the dielectric material.

A thirteenth aspect of the present invention is drawn to a specific embodiment of the semiconductor device according to the eleventh aspect, wherein the level of the top surface of the n-layer is higher than that of the top edge of the side-surface protective film such that a step is provided.

A fourteenth aspect of the present invention is drawn to a specific embodiment of the semiconductor device according to the eleventh aspect, wherein the semiconductor device has a p-electrode corresponding to the p-layer, and a first low-melting-point metal diffusion preventing layer formed between the p-electrode and the low-melting-point metal layer.

A fifteenth aspect of the present invention is drawn to a specific embodiment of the semiconductor device according to the twelfth aspect, wherein the semiconductor device has a p-layer; a p-electrode corresponding to the p-layer; a first low-melting-point metal diffusion preventing layer formed between the p-electrode and the metal film; and a second low-melting-point metal diffusion preventing layer formed between the metal film and the low-melting-point metal layer.

A sixteenth aspect of the present invention is drawn to a specific embodiment of the semiconductor device according to the eleventh aspect, wherein the side surface of the semiconductor device is perpendicular to the support substrate.

A seventeenth aspect of the present invention is drawn to a specific embodiment of the semiconductor device according to the eleventh or twelfth aspect, wherein the side-surface protective film comprises at least one of silicon dioxide, silicon nitride, zirconium oxide, niobium oxide, aluminum oxide, polyimide, polyamide and polyimide-amid.

A eighteenth aspect of the present invention is drawn to a specific embodiment of the semiconductor device according to the twelfth aspect, wherein the side-surface protective film comprises silicon dioxide, and the metal film comprises an Al film.

An nineteenth aspect of the present invention is drawn to a specific embodiment of the semiconductor device according to the eleventh or twelfth aspect, wherein the low-melting-point metal layer comprises at least one of Au—Sn, Au—Si, Ag—Sn—Cu, and Sn—Bi.

A twentieth aspect of the present invention is drawn to a specific embodiment of the semiconductor device according to the fourteenth aspect, wherein the first low-melting-point metal diffusion preventing layer comprises at least one species selected from among a multi-layer film containing at least Ti and Ni, a multi-layer film containing at least Ti, Ni, and Au, a multi-layer film containing at least W and Pt, and a multi-layer film containing at least W, Pt, and Au.

A twenty-first aspect of the present invention is drawn to a specific embodiment of the semiconductor device according to the fifteenth aspect, wherein the first low-melting-point metal diffusion preventing layer or the second low-melting-point metal diffusion preventing layer comprises at least one species selected from among a multi-layer film containing at least Ti and Ni, a multi-layer film containing at least Ti, Ni, and Au, a multi-layer film containing at least W and Pt, and a multi-layer film containing at least W, Pt, and Au.

A twenty-second aspect of the present invention is drawn to a specific embodiment of the semiconductor device according to the eleventh or twelfth aspect, wherein the semiconductor device is formed of a group III nitride semiconductor.

A twenty-third aspect of the present invention is drawn to a specific embodiment of the semiconductor device according to the eleventh or twelfth aspect, wherein the semiconductor device is a light-emitting device.

A twenty-fourth aspect of the present invention is drawn to a specific embodiment of the semiconductor device according to the twelfth aspect, wherein the metal film is provided on the side surface of the semiconductor device so as to cover the side-surface protective film.

According to the first or eleventh aspect of the present invention, since a side surface of the semiconductor device is covered with a side-surface protective film comprising a dielectric material, there can be prevented short circuit between an n-layer and a p-layer at the semiconductor device side surface, which would otherwise caused by a low-melting-point metal due to small thickness of the p-layer. In addition, the side-surface protective film can prevent cracking in the semiconductor device side surface, which would otherwise caused by physical impact generated during removal of a base through the laser lift-off process after bonding of the semiconductor device to a support substrate.

In the second or fourth aspect of the present invention, a buffer layer is provided between a base and a side-surface protective film for the following reasons. Since removal of a base through the laser lift-off process generates physical impact, the base is not removed consistently from a side-surface protective film. Therefore, as in the case of the first aspect of the invention, when only a side-surface protective film is provided on the semiconductor device, exfoliation of the side-surface protective film may occur at a side surface of the semiconductor device during removal of a base, and the side-surface protective film may fail to function as a protective film. Thus, provision of a buffer layer can reduce physical impact on the side-surface protective film during removal of the base, and can prevent exfoliation of the side-surface protective film from a side surface of the semiconductor device. Therefore, the side-surface protective film does not lose the function of protecting the semiconductor device side surface, and cracking in the semiconductor device side surface is more effectively prevented, as compared with the case where only the side-surface protective film is provided.

In the third or fourth aspect of the present invention, a side surface of the semiconductor device is covered with a side-surface protective film made of a dielectric material, and a metal film which has a good bonding property to the side-surface protective film is formed between the side-surface protective film and a low-melting-point metal layer. The side-surface protective film can prevent, at the semiconductor device side surface, short circuit via the low-melting-point metal. In addition, the side-surface protective film can prevent cracking in the semiconductor device side surface, which would otherwise caused by physical impact generated during removal of a base through the laser lift-off process after bonding of the semiconductor device to a support substrate.

In the present invention, the metal film is provided for the following reasons. When only a side-surface protective film is provided, separation may occur between the side-surface protective film and a low-melting-point metal layer, due to poor bonding therebetween, and voids may be provided between the side-surface protective film and the low-melting-point metal layer. During removal of a base, such voids may cause exfoliation of the side-surface protective film, as well as cracking in a side surface of the semiconductor device. Thus, provision of a metal film which has a good bonding property to the side-surface protective film between the side-surface protective film and the low-melting-point metal layer can prevent generation of voids due to separation of the side-surface protective film from the low-melting-point metal layer, and can prevent exfoliation of the side-surface protective film from a side surface of the semiconductor device. Therefore, the side-surface protective film does not lose the function of protecting the semiconductor device side surface, and cracking in the semiconductor device side surface is more effectively prevented, as compared with the case where only the side-surface protective film is provided.

According to the aforementioned effects of the present invention, defective products during production of semiconductor devices are reduced, increasing product yield.

The semiconductor device according to the eleventh aspect has, on a side surface thereof, a side-surface protective film. Therefore, neither short circuit nor cracking occurs at the side surface of the semiconductor device.

The semiconductor device according to the twelfth aspect has, on a side surface thereof, a side-surface protective film, and has, between the side-surface protective film and a low-melting-point metal layer, a metal film which has a good bonding property to the side-surface protective film. Therefore, no cracking occurs in the side surface of the semiconductor device.

In the semiconductor device according to the twenty-fourth aspect, the metal film is provided on the side surface of the semiconductor device so as to cover the side-surface protective film. Therefore, light emission through the side surface can be prevented.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1A:
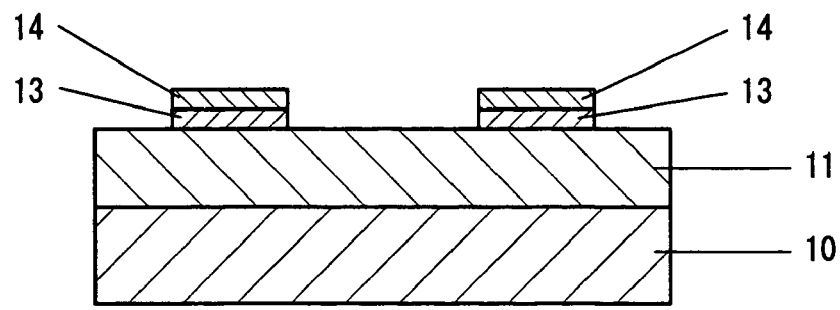
FIGS. 1A to 1H are cross-sectional views of semiconductor structures for describing the steps of producing a light-emitting device performed in Embodiment 1.

Referring to the drawings, specific embodiments of the present invention will next be described. However, the present invention is not limited to the embodiments.

Embodiment 1

FIGS. 1A to 1H are cross-sectional views of semiconductor structures for describing the steps of producing a light-emitting device through laser lift-off in Embodiment 1.

Figure 2:
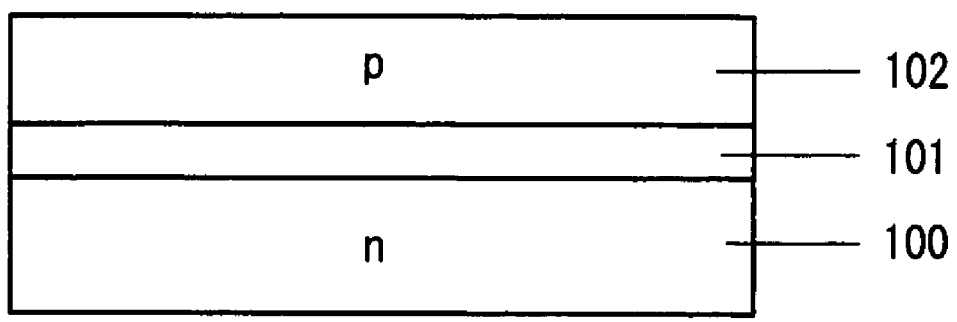
FIG. 2 is a configuration of group III nitride semiconductor layers forming the light-emitting device produced in Embodiment 1.

Firstly, a group III nitride semiconductor layer 11 is formed on a sapphire substrate 10 through epitaxial growth. A p-electrode 13 and a low-melting-point metal diffusion preventing layer 14 are formed on the semiconductor layer in the areas where light-emitting devices 12 are provided (FIG. 1A). The p-electrode may be formed from a metal having high optical reflectance and low contact resistance; for example, Ag, Rh, Pt, Ru, or an alloy containing such a metal as a primary component. Alternatively, the p-electrode may be made of, for example, Ni, an Ni alloy, or an Au alloy; or may be formed of a composite layer including a transparent electrode film (e.g., ITO film) and a highly reflective metal film. The low-melting-point metal diffusion preventing layer 14 is formed of, for example, a Ti/Ni-containing multi-layer film (e.g., Ti/Ni/Au film), or a W/Pt-containing multi-layer film (e.g., W/Pt/Au film). As shown in FIG. 2, the group III nitride semiconductor layer 11 is formed of an n-layer 100, an MQW layer 101, and a p-layer 102.

Figure 1B:
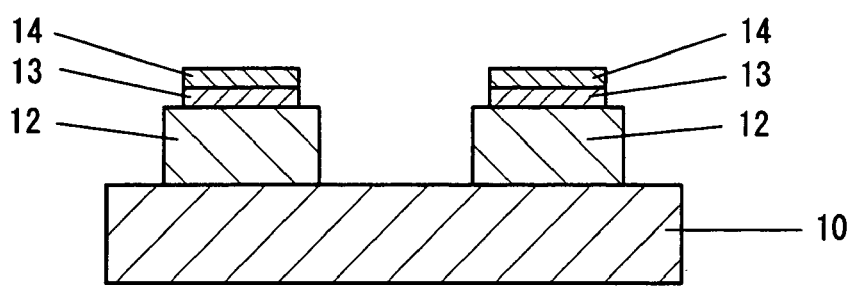

Subsequently, predetermined areas of the group III nitride semiconductor layer 11 are etched until the sapphire substrate 10 is exposed, whereby a plurality of light-emitting devices 12 are separately provided (FIG. 1B). Etching is performed such that side surfaces of each light-emitting device 12 are perpendicular to the sapphire substrate.

Figure 1C:
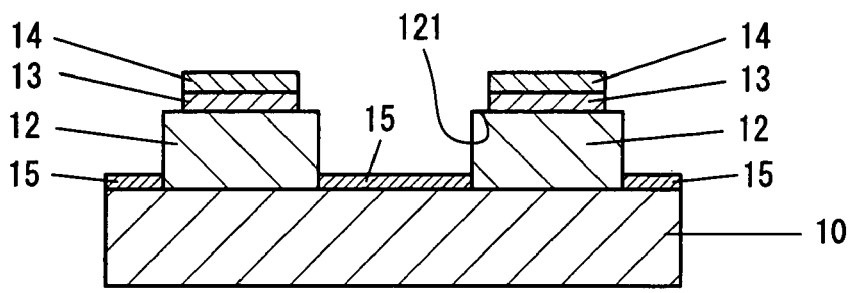

Then, a resist film 15 serving as a buffer layer is formed on the entire exposed top surface of the substrate. Since side surfaces of each light-emitting device 12 are perpendicular to the sapphire substrate, the resist film 15 is not formed on the side surfaces. The resist film 15 preferably has a thickness smaller than that of the n-layer 100, which is joined to the sapphire substrate 10 of the light-emitting device 12 and preferably as thin as possible. When the resist film is thicker than the n-layer 100, a side-surface protective film is not formed on side surfaces during a subsequent step, failing to attain a short circuit prevention effect. Generally, since the n-layer 100 has a thickness of about 2 μm to about 4 μm, the resist film preferably has a thickness of 1 μm or less. Thereafter, the resist film 15 formed on the surface of the light-emitting device 12 is removed (FIG. 1C).

Other than resist, the buffer layer may be formed from Au. However, when deposited on a side surface of the light-emitting device 12, Au must be removed from the side surface. Therefore, Au film preferably has a thickness of about 25 to about 50 nm. When the thickness is 50 nm or more, Au deposited on a side surface is difficult to remove, whereas when the thickness is 25 nm or less, grains may be grown in the Au film. Needless to say, both cases are not preferred. The resist may also be formed from a resin such as polyimide.

Figure 1D:
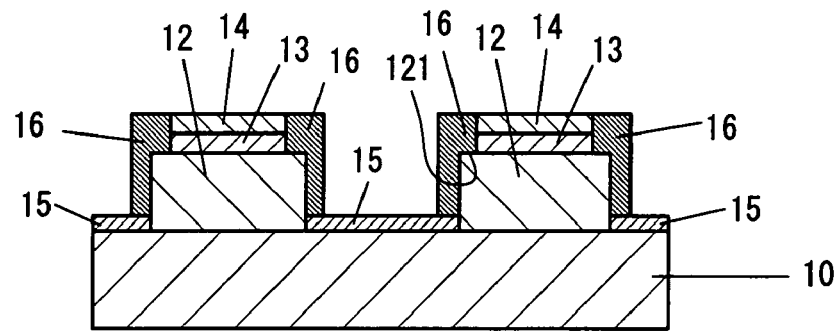

Subsequently, a side-surface protective film 16 made of $SiO_2$ is formed, through plasma CVD, on the side surface of the light-emitting device 12 and on the area of the top surface 121 of the light-emitting device 12 where the p-electrode 13 and the low-melting-point metal diffusion preventing layer 14 have not been formed (FIG. 1D). The side-surface protective film 16 prevents short circuit between the n-layer 100 and the p-layer 102 on a side surface of the light-emitting device 12. The protective film preferably has a thickness of about 100 nm to about 500 nm. When the thickness of 100 nm or less, adhesion between a side surface of the light-emitting device 12 and the side-surface protective film 16 disadvantageously decreases, whereas when the thickness is 500 nm or more, a considerably long time is required for etching performed in a subsequent patterning step. Both cases are not preferred. Other than $SiO_2$, $Si_3N_4$ (silicon nitride), $ZrO_2$ (zirconium oxide), NbO (niobium oxide), $Al_2O_3$ (aluminum oxide), polyimide, polyamide and polyimide-amid, etc. may also be used.

Figure 1E:
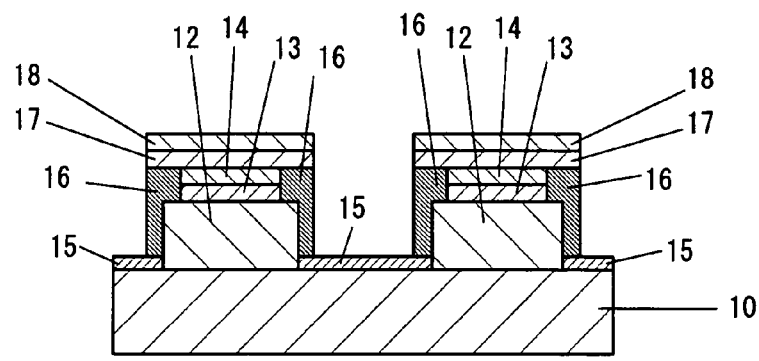

Subsequently, another low-melting-point metal diffusion preventing layer 17 is formed on the top surface of the low-melting-point metal diffusion preventing layer 14 and of the side-surface protective film 16, and a low-melting-point metal layer 18 is formed on the top surface of the low-melting-point metal diffusion preventing layer 17 (FIG. 1E). The low-melting-point metal layer 18 may be formed of a eutectic metal layer (e.g., an Au—Sn layer, an Au—Si layer, an Ag—Sn—Cu layer, or an Sn—Bi layer); or may be formed of, for example, a layer of Au, Sn, or Cu (although such a metal is not a low-melting-point metal).

The side-surface protective film 16 and the low-melting-point metal diffusion preventing layer 17 are formed into predetermined patterns through photolithography.

Figure 1F:
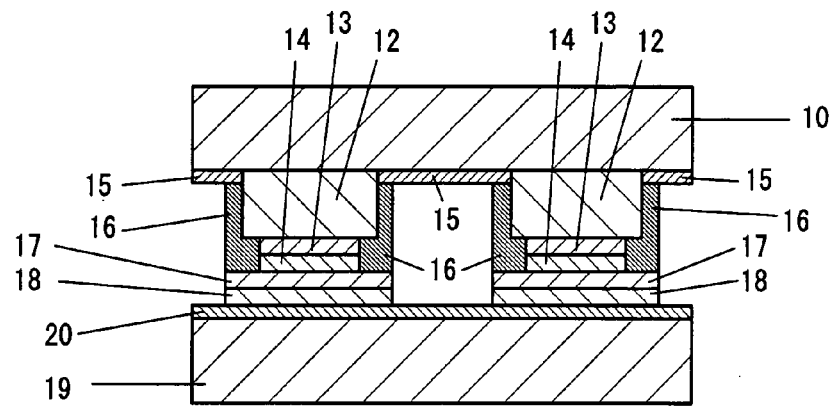

Subsequently, a support substrate 19 and the low-melting-point metal layer 18 are bonded to each other by the mediation of a low-melting-point metal layer 20 which has been formed on the top surface of the support substrate 19 made of Si (FIG. 1F). In place of Si, the support substrate 19 may be formed from GaAs, Cu, or Cu—W. The low-melting-point metal diffusion preventing layers 14 and 17 prevent diffusion of metals forming the low-melting-point metal layers 18 and 20 through the low-melting-point metal diffusion preventing layers 14 and 17.

Figure 1G:
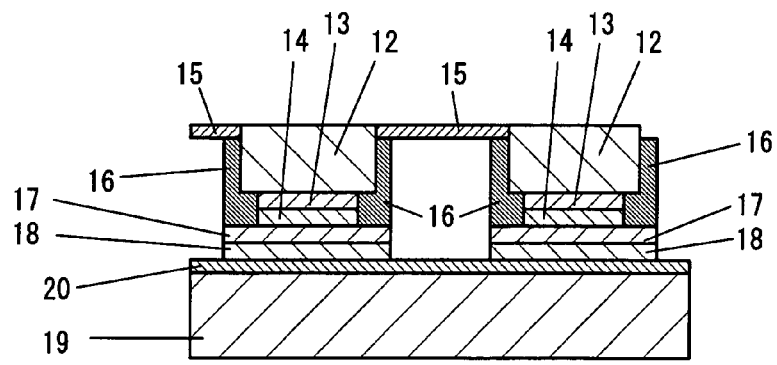

Through the laser lift-off technique, the sapphire substrate 10 is removed (FIG. 1G). In this step, a wafer is irradiated with a KrF laser light (wavelength: 248 nm) at 0.7 J/cm² or higher. Since bending strength between the resist film 15 and the sapphire substrate 10, and that between the resist film 15 and the side-surface protective film 16 are weak, the sapphire substrate or the protective film can readily be peeled off. Therefore, by virtue of the resist film 15, physical impact generated during removal of the sapphire substrate 10 is not directly propagated to the side-surface protective film 16. Therefore, breakage or defoliation of the side-surface protective film 16 can be prevented, whereby cracking in side surfaces of the light-emitting device 12 is prevented. Notably, during removal of the sapphire substrate 10, the resist film 15 may also be peeled off and removed. However, this is not problematic, since the resist film is removed in a subsequent step.

Figure 1H:
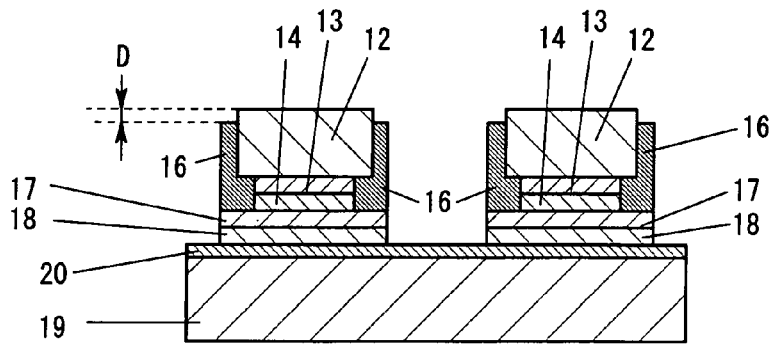

Next, the remaining resist film 15 is removed through washing (FIG. 1H). When Au film is used as a buffer layer instead of the resist film 15, the Au film can be washed out through application of an iodine-containing etchant. Through removal of the resist film 15, a step D is provided between the surface of the light-emitting device 12 and the top edge of the side-surface protective film 16, the step having a depth equivalent to the thickness of the resist film 15. The step D may be buried with a material identical to or different from that of the side-surface protective film 16, in a subsequent step.

Subsequently, n-electrodes are formed, and the wafer is diced, whereby light-emitting devices 12 are produced on the support substrate 19. During cutting of the low-melting-point metal layer 20, metal powder is generated. However, each light-emitting device is protected with the side-surface protective film 16; i.e., side surfaces of the light-emitting device 12 are protected, whereby short circuit between the n-layer 100 and the p-layer 102 is prevented.

In Embodiment 1, a light-emitting device is produced. However, the present invention is not limited to the production of a light-emitting device, and encompasses any semiconductor devices which can be produced through the laser lift-off technique. Other than semiconductor devices produced from a group III nitride semiconductor, the invention is also applicable to semiconductor devices produced from a group III-V semiconductor such as GaAs or GaP.

In Embodiment 1, isolation to provide light-emitting devices 12 is performed through etching after formation of the p-electrode 13 and the low-melting-point metal diffusion preventing layer 14. Alternatively, the p-electrode 13 and the low-melting-point metal diffusion preventing layer 14 may be formed after isolation to provide provide light-emitting devices 12 through etching. The buffer layer may be preliminarily patterned such that the buffer layer is formed exclusively in an area in the vicinity of a side surface of each light-emitting device 12 on the sapphire substrate 10. In this case, removal of the buffer layer in a subsequent step can be more readily performed.

Embodiment 2

FIGS. 3A to 3G are cross-sectional views of semiconductor structures for describing the steps of producing a light-emitting device through laser lift-off in Embodiment 2.

Figure 3A:
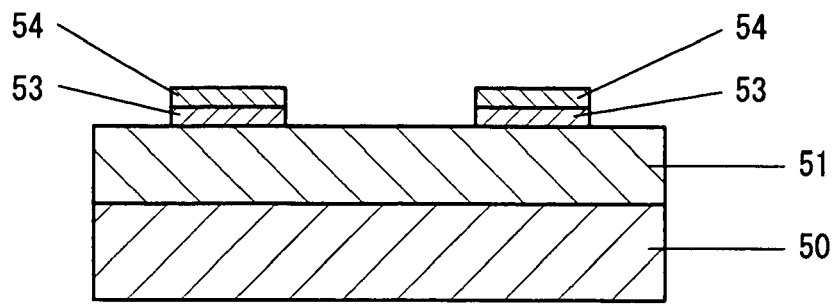
FIGS. 3A to 3G are cross-sectional views of semiconductor structures for describing the steps of producing a light-emitting device performed in Embodiment 2.
Figure 4:
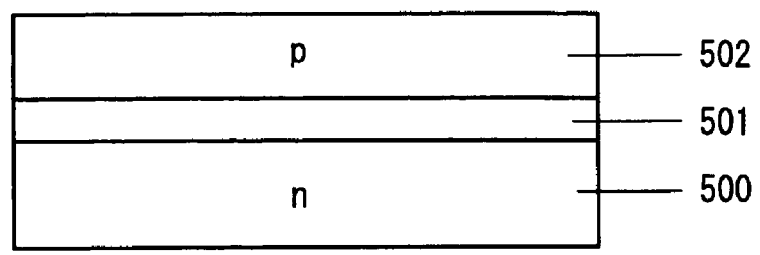
FIG. 4 is a configuration of group III nitride semiconductor layers forming the light-emitting device produced in Embodiment 2.

Firstly, a group III nitride semiconductor layer 51 is formed on a sapphire substrate 50 through epitaxial growth. A p-electrode 53 and a low-melting-point metal diffusion preventing layer 54 are formed on the semiconductor layer in the areas where light-emitting devices 52 are provided (FIG. 3A). The p-electrode may be formed from a metal having high optical reflectance and low contact resistance; for example, Ag, Rh, Pt, Ru, or an alloy containing such a metal as a primary component. Alternatively, the p-electrode may be made of, for example, Ni, an Ni alloy, or an Au alloy; or may be formed of a composite layer including a transparent electrode film (e.g., ITO film) and a highly reflective metal film. The low-melting-point metal diffusion preventing layer 54 is formed of, for example, a Ti/Ni-containing multi-layer film (e.g., Ti/Ni/Au film), or a W/Pt-containing multi-layer film (e.g., W/Pt/Au film). As shown in FIG. 4, the group III nitride semiconductor layer 51 is formed of an n-layer 500, an MQW layer 501, and a p-layer 502.

Figure 3B:
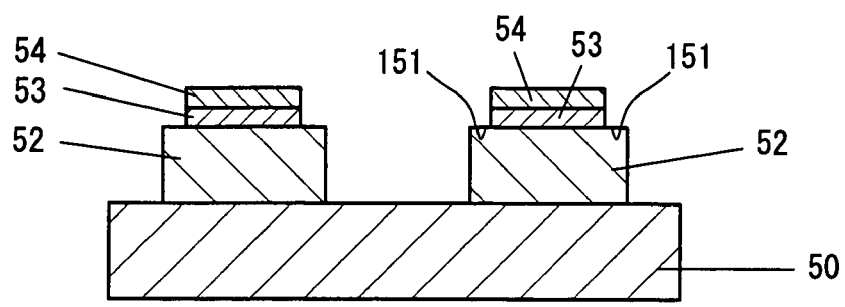

Subsequently, predetermined areas of the group III nitride semiconductor layer 51 are etched until the sapphire substrate 50 is exposed, whereby a plurality of light-emitting devices 52 are separately provided (FIG. 3B). Etching is performed such that side surfaces of each light-emitting device 52 are perpendicular to the sapphire substrate.

Figure 3C:
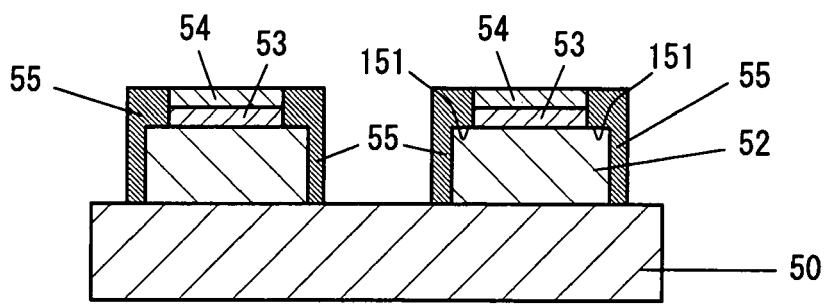

Subsequently, a side-surface protective film 55 made of $SiO_2$ is formed, through plasma CVD, on the side surface of the light-emitting device 52 and on the area of the top surface 151 of the light-emitting device 52 where the p-electrode 53 and the low-melting-point metal diffusion preventing layer 54 have not been formed (FIG. 3C). The protective film preferably has a thickness of about 100 nm to about 500 nm. When the thickness of 100 nm or less, adhesion between a side surface of the light-emitting device 52 and the side-surface protective film 55 disadvantageously decreases, whereas when the thickness is 500 nm or more, a considerably long time is required for etching performed in a subsequent patterning step. Both cases are not preferred. Other than $SiO_2$, $Si_3N_4$ (silicon nitride), $ZrO_2$ (zirconium oxide), NbO (niobium oxide), $Al_2O_3$ (aluminum oxide), polyimide, polyamide and polyimide-amid, etc. may also be used.

Figure 3D:
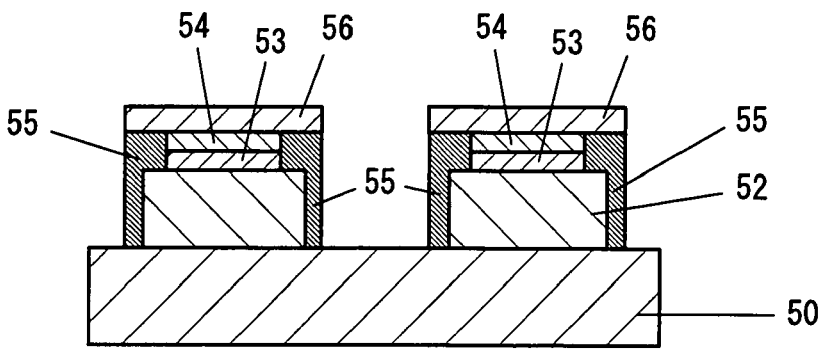

Subsequently, an Al metal film 56 is formed on the top surface of the low-melting-point metal diffusion preventing layer 54 and of the side-surface protective film 55 (FIG. 3D). No particular limitation is imposed on the material of the metal film 56, so long as the metallic material exhibits high bonding strength to the side-surface protective film 55. Instead of Al, a metal such as Ni, Ti, or V may be employed.

Figure 3E:
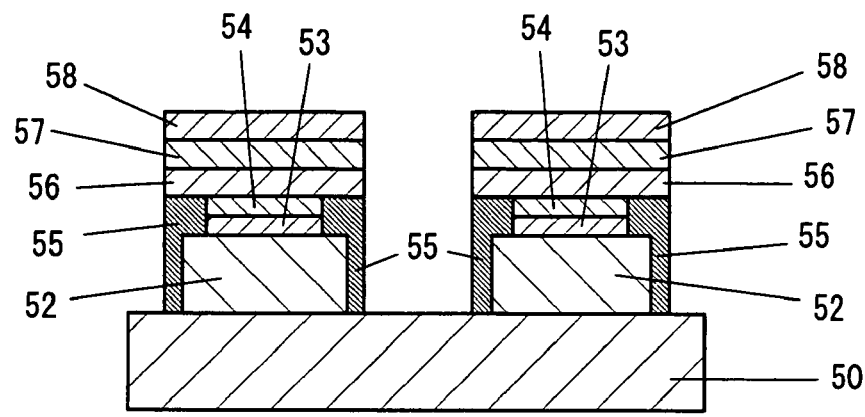

Subsequently, another low-melting-point metal diffusion preventing layer 57 is formed on the top surface of the metal film 56, and a low-melting-point metal layer 58 is formed on the top surface of the low-melting-point metal diffusion preventing layer 57 (FIG. 3E). The low-melting-point metal layer 58 may be formed of a eutectic metal layer (e.g., an Au—Sn layer, an Au—Si layer, an Ag—Sn—Cu layer, or an Sn—Bi layer); or may be formed of, for example, a layer of Au, Sn, or Cu (although such a metal is not a low-melting-point metal). The side-surface protective film 55, the metal film 56, and the low-melting-point metal diffusion preventing layer 57 are formed into predetermined patterns through photolithography.

Figure 3F:
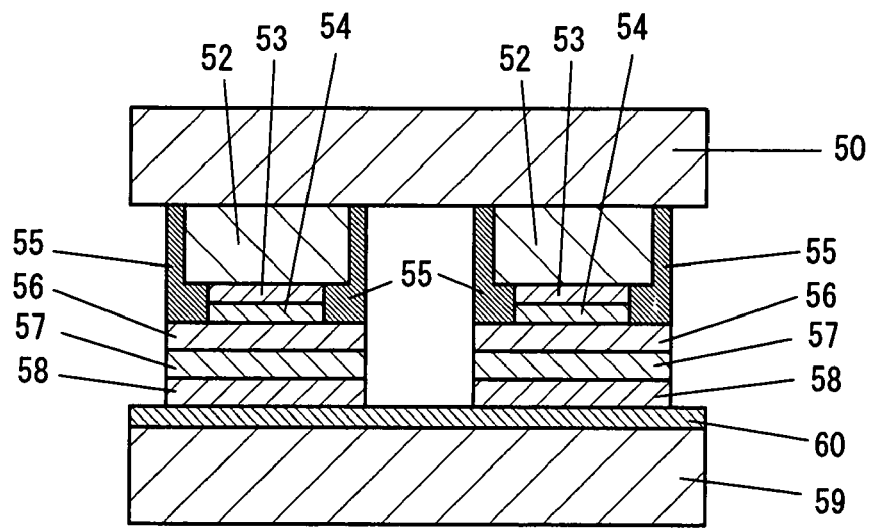

Subsequently, a support substrate 59 and the low-melting-point metal layer 58 are bonded together by the mediation of a low-melting-point metal layer 60 which has been formed on the top surface of the support substrate 59 made of Si (FIG. 3F). In place of Si, the support substrate 59 may be formed from GaAs, Cu, or Cu—W. The low-melting-point metal diffusion preventing layers 54 and 57 prevent diffusion of metals forming the low-melting-point metal layers 58 and 60 through the low-melting-point metal diffusion preventing layers 54 and 57.

Figure 3G:
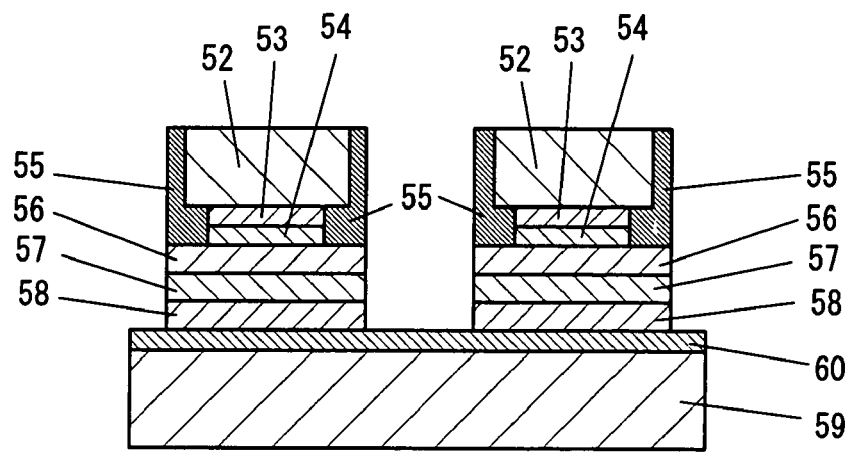

Through the laser lift-off technique, the sapphire substrate 50 is removed (FIG. 3G). In this step, a wafer is irradiated with a KrF laser light (wavelength: 248 nm) at 0.7 J/cm² or higher.

During the laser lift-off process, if the metal film 56 has not been provided, bonding between the side-surface protective film 55 and the low-melting-point metal layer 58 is unsatisfactory. In such a case, the low-melting-point metal layer 58 is defoliated from the top edge of the side-surface protective film 55, and a cavity is provided between the metal layer 58 and the protective film 55. The cavity may cause defoliation of the side-surface protective film 55 during removal of the sapphire substrate 50, or cracking of a side surface of the light-emitting device 52. Thus, in Embodiment 2, the metal film 56 is provided between the top edge of the side-surface protective film 55 and the low-melting-point metal layer 58, the metal film being formed from a metal exhibiting good bonding strength with the side-surface protective film, whereby cavity formation, defoliation of the side-surface protective film 55, and cracking of a side surface of the light-emitting device 52 can be prevented.

Subsequently, n-electrodes are formed, and the wafer is diced, whereby light-emitting devices 52 are produced on the support substrate 59.

Embodiment 3

Figure 5:
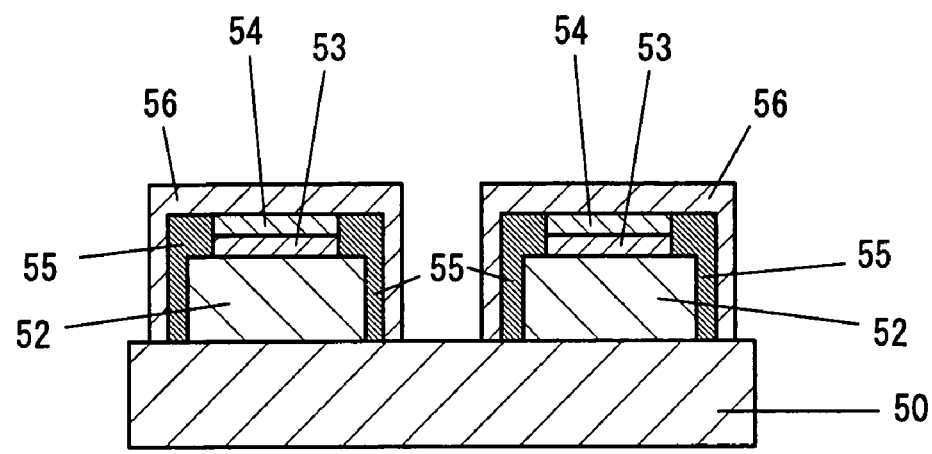
FIG. 5 is a cross-sectional view for describing a part of the steps of producing a light-emitting device performed in Embodiment 3.

As shown in FIG. 5, Embodiment 3 of the method of the invention is identical to Embodiment 2, except that the metal film 56 is also provided on the side surfaces of the light-emitting device 52 so as to cover the side-surface protective film 55. Since Al is a metal having high optical reflectance, light emission through a side surface of the light-emitting device 52 can be prevented by the metal film 56. Particularly when a side surface of the light-emitting device 52 is slanted, formation of the metal film 56 also on the slanted surface is preferred.

In Embodiments 2 and 3, a light-emitting device is produced. However, the present invention is not limited to the production of a light-emitting device, and encompasses any semiconductor devices which can be produced through the laser lift-off technique. Other than semiconductor devices produced from a group III nitride semiconductor, the invention is also applicable to semiconductor devices produced from a group III-V semiconductor such as GaAs or GaP.

In Embodiments 2 and 3, isolation to provide light-emitting devices 52 is performed through etching after formation of the p-electrode 53 and the low-melting-point metal diffusion preventing layer 54. Alternatively, the p-electrode 53 and the low-melting-point metal diffusion preventing layer 54 may be formed after isolation to provide light-emitting devices 52 through etching.

Embodiment 4

Embodiment 4 is a combination of Embodiments 1 and 2. Specifically, the procedure of Embodiment 2 is carried out employing the buffer layer 15 of Embodiment 1, to thereby produce semiconductor devices. FIGS. 6A to 6H are cross-sections for describing the steps of producing a light-emitting device through laser lift-off in Embodiment 4. The same reference numerals as employed in Embodiment 2 are used to denote the same members.

Figure 6A:
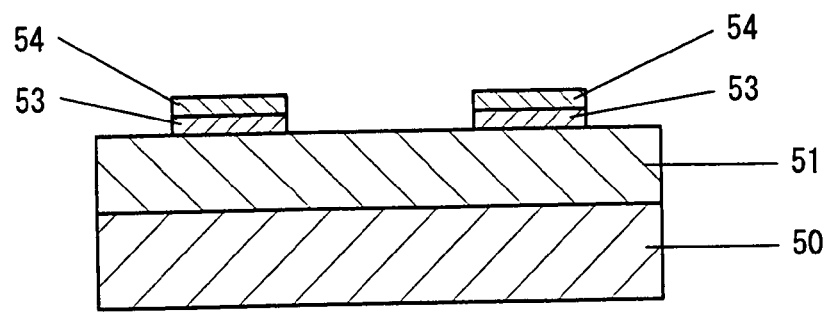
FIGS. 6A to 6H are cross-sectional views of semiconductor structures for describing the steps of producing a light-emitting device performed in Embodiment 4.

Firstly, a group III nitride semiconductor layer 51 is formed on a sapphire substrate 50 through epitaxial growth. A p-electrode 53 and a low-melting-point metal diffusion preventing layer 54 are formed on the semiconductor layer in the areas where light-emitting devices 52 are provided (FIG. 6A). As shown in FIG. 4, the group III nitride semiconductor layer 51 is formed of an n-layer 500, an MQW layer 501, and a p-layer 502.

Figure 6B:
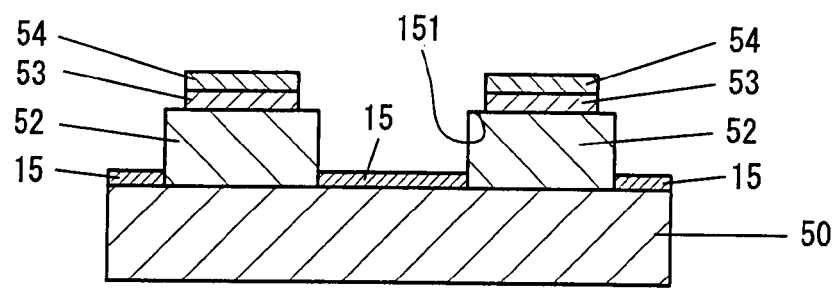

Subsequently, predetermined areas of the group III nitride semiconductor layer 51 are etched until the sapphire substrate 50 is exposed, whereby a plurality of light-emitting devices 52 are separately provided (FIG. 6B). Etching is performed such that side surfaces of each light-emitting device 52 are perpendicular to the sapphire substrate.

Then, as shown in FIG. 6B, a resist film 15 serving as a buffer layer is formed on the entire exposed top surface of the substrate. Since side surfaces of each light-emitting device 52 are perpendicular to the sapphire substrate, the resist film 15 is not formed on the side surfaces. The resist film 15 preferably has a thickness smaller than that of the n-layer 500, which is joined to the sapphire substrate 50 of the light-emitting device 52 and preferably as thin as possible. When the resist film is thicker than the n-layer 500, a side-surface protective film is not formed on side surfaces during a subsequent step, failing to attain a short circuit prevention effect. Generally, since the n-layer 500 has a thickness of about 2 μm to about 4 μm, the resist film preferably has a thickness of 1 μm or less. Thereafter, the resist film 15 formed on the surface of the light-emitting device 52 is removed (FIG. 6B).

Other than resist, the buffer layer may be formed from Au. However, when deposited on a side surface of the light-emitting device 52, Au must be removed from the side surface. Therefore, Au film preferably has a thickness of about 25 to about 50 nm. When the thickness is 50 nm or more, Au deposited on a side surface is difficult to remove, whereas when the thickness is 25 nm or less, a granular grain boundary may be grown. Needless to say, both cases are not preferred. The resist may also be formed from a resin such as polyimide.

Figure 6C:
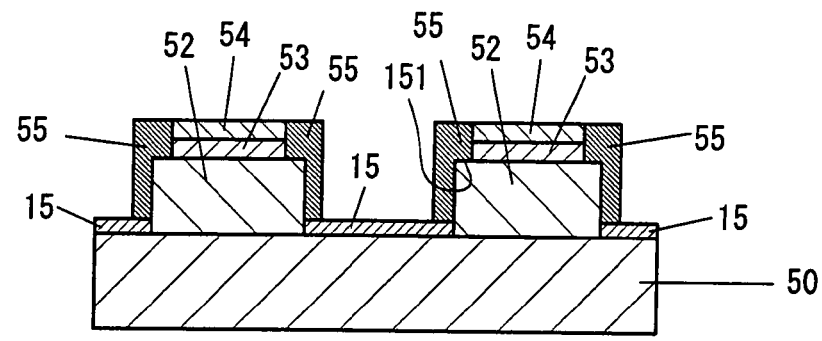

Subsequently, a side-surface protective film 55 made of $SiO_2$ is formed, through plasma CVD, on the side surface of the light-emitting device 52 and on the area of the top surface 151 of the light-emitting device 52 where the p-electrode 53 and the low-melting-point metal diffusion preventing layer 54 have not been formed (FIG. 6C).

Figure 6D:
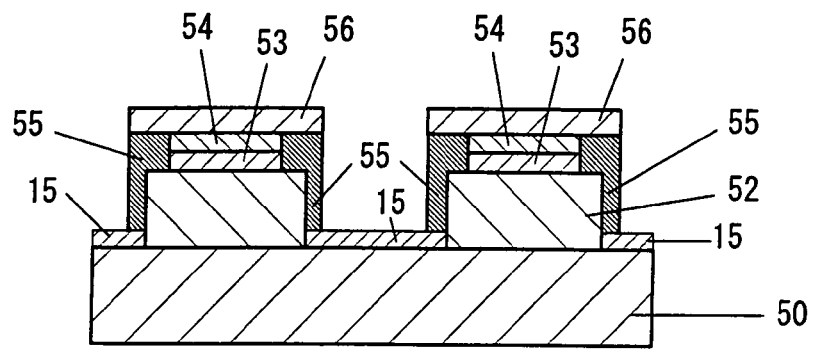

Subsequently, an Al metal film 56 is formed on the top surface of the first low-melting-point metal diffusion preventing layer 54 and of the side-surface protective film 55 (FIG. 6D). No particular limitation is imposed on the material of the metal film 56, so long as the metallic material exhibits high bonding strength to the side-surface protective film 55. Instead of Al, a metal such as Ni, Ti, or V may be employed.

Figure 6E:
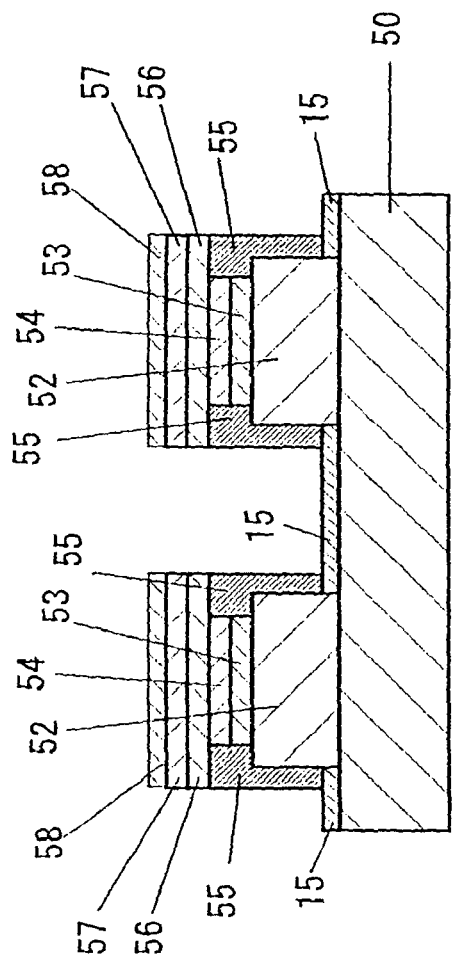

Subsequently, a second low-melting-point metal diffusion preventing layer 57 is formed on the top surface of the metal film 56, and a low-melting-point metal layer 58 is formed on the top surface of the second low-melting-point metal diffusion preventing layer 57 (FIG. 6E). The side-surface protective film 55, the metal film 56, and the low-melting-point metal diffusion preventing layer 57 are formed into predetermined patterns through photolithography.

Figure 6F:
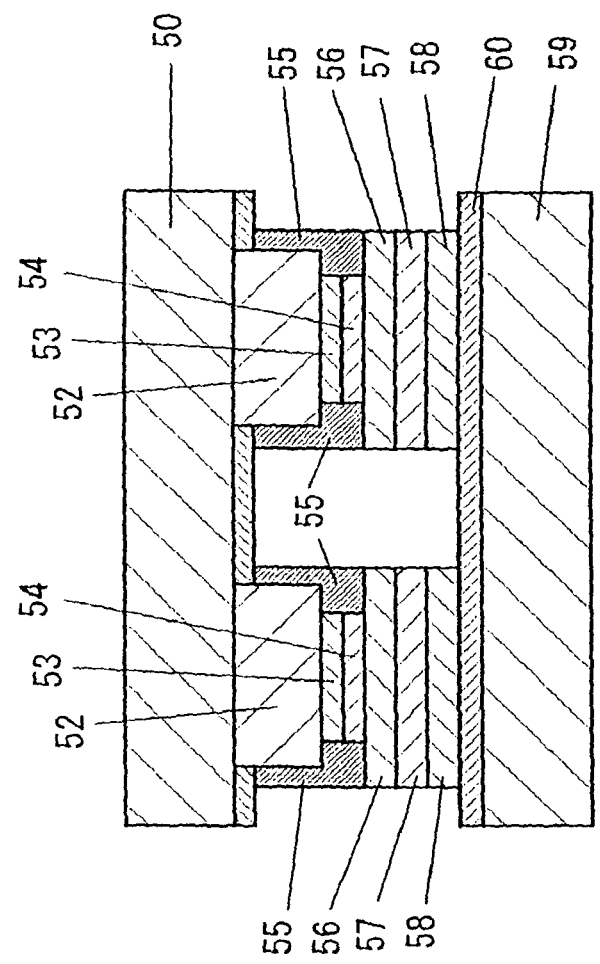

Subsequently, a support substrate 59 and the low-melting-point metal layer 58 are bonded together by the mediation of a low-melting-point metal layer 60 which has been formed on the top surface of the support substrate 59 made of Si (FIG. 6F). The low-melting-point metal diffusion preventing layers 54 and 57 prevent diffusion of metals forming the low-melting-point metal layers 58 and 60 through the low-melting-point metal diffusion preventing layers 54 and 57.

Figure 6G:
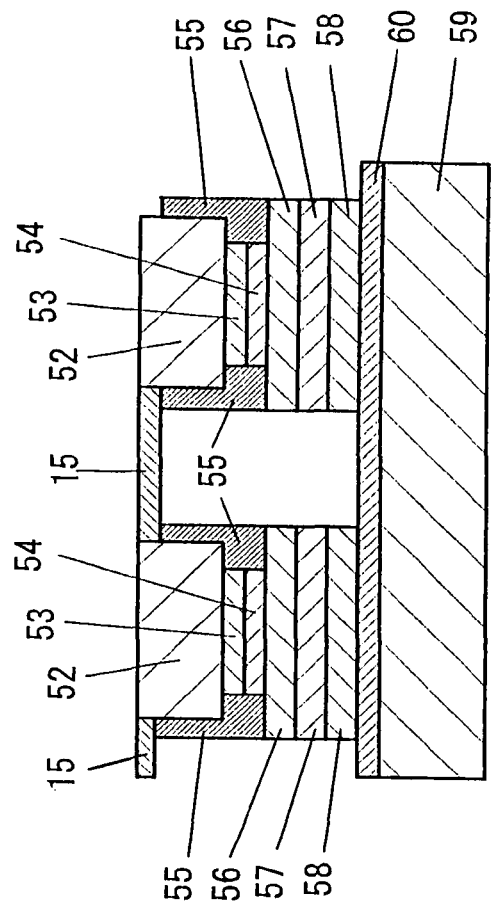

Through the laser lift-off technique, the sapphire substrate 50 is removed (FIG. 6G). In this step, a wafer is irradiated with a KrF laser light (wavelength: 248 nm) at 0.7 J/cm² or higher. Since bending strength between the resist film 15 and the sapphire substrate 50, and that between the resist film 15 and the side-surface protective film 55 are weak, the sapphire substrate or the protective film can readily be peeled off. Therefore, by virtue of the resist film 15, physical impact generated during removal of the sapphire substrate 50 is not directly propagated to the side-surface protective film 55. Therefore, breakage or defoliation of the side-surface protective film 55 can be prevented, whereby cracking in side surfaces of the light-emitting device 52 is prevented. Notably, during removal of the sapphire substrate 50, the resist film 15 may also be peeled off and removed. However, this is not problematic, since the resist film is removed in a subsequent step.

During the laser lift-off process, if the metal film 56 has not been provided, bonding between the side-surface protective film 55 and the low-melting-point metal layer 58 is unsatisfactory. In such a case, the low-melting-point metal layer 58 is defoliated from the top edge of the side-surface protective film 55, and a cavity is provided between the metal layer 58 and the protective film 55. The cavity may cause defoliation of the side-surface protective film 55 during removal of the sapphire substrate 50, or cracking of a side surface of the light-emitting device 52. Thus, in Embodiment 4, the metal film 56 is provided between the top edge of the side-surface protective film 55 and the low-melting-point metal layer 58, the metal film being formed from a metal exhibiting good bonding strength with the side-surface protective film, whereby cavity formation, defoliation of the side-surface protective film 55, and cracking of a side surface of the light-emitting device 52 can be prevented.

Figure 6H:
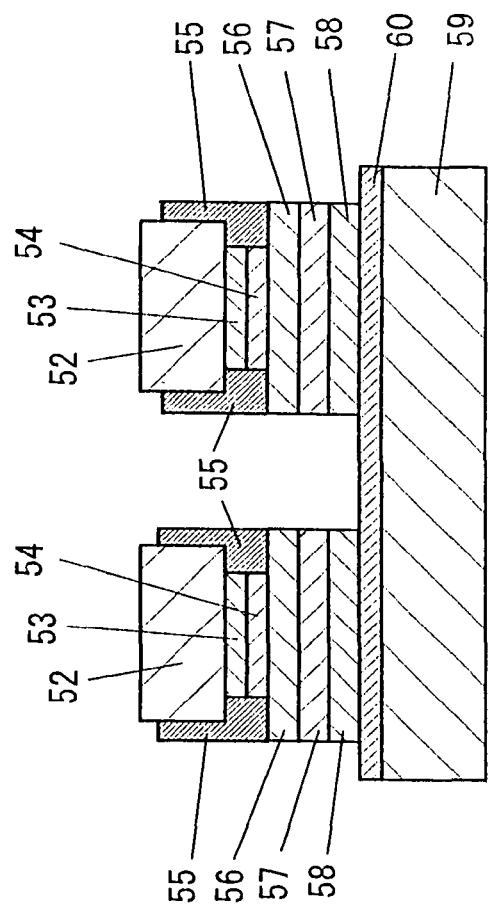

Next, the remaining resist film 15 is removed through washing (FIG. 6H). When Au film is used as a buffer layer instead of the resist film 15, the Au film can be washed out through application of an iodine-containing etchant. Through removal of the resist film 15, a step D is provided between the surface of the light-emitting device 52 and the top edge of the side-surface protective film 55, the step having a depth equivalent to the thickness of the resist film 15. The step D may be buried with a material identical to or different from that of the side-surface protective film 55, in a subsequent step.

Subsequently, n-electrodes are formed, and the wafer is diced, whereby light-emitting devices 52 are produced on the support substrate 59. During cutting of the low-melting-point metal layer 60, metal powder is generated. However, each light-emitting device is protected with the side-surface protective film 55; i.e., side surfaces of the light-emitting device 52 are protected, whereby short circuit between the n-layer 500 and the p-layer 502 is prevented.

According to the present invention, product yield of semiconductor devices through the laser lift-off process can be enhanced.

What is claimed is:

1. A method for producing a group III-V semiconductor device, the method comprising
   forming, on a base, a plurality of semiconductor devices isolated from one another, each semiconductor device having at least an n-layer proximal to the base, and a p-layer distal to the base, and having a p-electrode formed on the top surface of the p-layer, and a first low-melting-point metal diffusion preventing layer, the low-melting-point metal diffusion preventing layer being formed on the top surface of the p-electrode;
   forming, from a dielectric material, a side-surface protective film so as to cover a side surface of each semiconductor device;
   bonding the semiconductor device to a conductive support substrate via a low-melting-point metal layer; and
   removing the base through the laser lift-off process.

2. A method for producing a group III-V semiconductor device, the method comprising
   forming, on a base, a plurality of semiconductor devices isolated from one another, each semiconductor device having at least an n-layer proximal to the base, and a p-layer distal to the base, and having a p-electrode formed on the top surface of the p-layer, and a first low-melting-point metal diffusion preventing layer formed on the top surface of the p-electrode;

forming a buffer layer on the top surface of the base and at least in the vicinity of a side surface of each semiconductor device;

forming, from a dielectric material, a side-surface protective film so as to cover a side surface of the semiconductor device;

bonding the semiconductor device to a conductive support substrate via a low-melting-point metal layer;

removing the base through the laser lift-off process; and removing the buffer layer, wherein the bonding strength of the buffer layer to the base or the side-surface protective film is lower than the bonding strength between the base and the side-surface protective film.

3. A method for producing a semiconductor device as described in claim 1, wherein the method further comprises forming, at least on the top edge of the side-surface protective film, a film of a metal which has a good bonding property to the dielectric material; and forming a second low-melting-point metal diffusion preventing layer on the top surface of the metal film.

4. A method for producing a semiconductor device as described in claim 2, wherein the method further comprises forming, at least on the top edge of the side-surface protective film, a film of a metal which has a good bonding property to the dielectric material; and forming a second low-melting-point metal diffusion preventing layer on the top surface of the metal film.

5. A method for producing a semiconductor device as described in claim 2, wherein the buffer layer is formed of a resist film or an Au film.

6. A method for producing a semiconductor device as described in claim 4, wherein the buffer layer is formed of a resist film or an Au film.

7. A method for producing a semiconductor device as described in claim 1, wherein the side-surface protective film comprises at least one of silicon dioxide, silicon nitride, zirconium oxide, niobium oxide, aluminum oxide, polyimide, polyamide and polyimide-amid.

8. A method for producing a semiconductor device as described in claim 2, wherein the side-surface protective film comprises at least one of silicon dioxide, silicon nitride, zirconium oxide, niobium oxide, aluminum oxide, polyimide, polyamide and polyimide-amid.

9. A method for producing a semiconductor device as described in claim 3, wherein the side-surface protective film comprises at least one of silicon dioxide, silicon nitride, zirconium oxide, niobium oxide, aluminum oxide, polyimide, polyamide and polyimide-amid.

10. A method for producing a semiconductor device as described in claim 3, wherein the side-surface protective film comprises silicon dioxide, and the metal film comprises an Al film.

11. A method for producing a semiconductor device as described in claim 4, wherein the side-surface protective film comprises silicon dioxide, and the metal film comprises an Al film.

12. A method for producing a semiconductor device as described in claim 1, wherein the first low-melting-point metal layer comprises at least one of Au—Sn, Au—Si, Ag—Sn—Cu, and Sn—Bi.

13. A method for producing a semiconductor device as described in claim 2, wherein the first low-melting-point metal layer comprises at least one of Au—Sn, Au—Si, Ag—Sn—Cu, and Sn—Bi.

14. A method for producing a semiconductor device as described in claim 1, wherein the semiconductor device is formed of a group III nitride semiconductor.

15. A method for producing a semiconductor device as described in claim 1, wherein the semiconductor device is a light-emitting device.

* * * * *